(12) United States Patent
Kau et al.

(10) Patent No.: US 12,308,233 B2
(45) Date of Patent: May 20, 2025

(54) DUAL CRITICAL DIMENSION PATTERNING

(71) Applicant: Taiwan Semiconductor Manufacturing Company, Ltd., Hsinchu (TW)

(72) Inventors: Kuo-Chang Kau, Yuanli Township (TW); Wen-Yun Wang, Taipei (TW); Chia-Chu Liu, Shin-Chu (TW); Hua-Tai Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 986 days.

(21) Appl. No.: 17/370,382

(22) Filed: Jul. 8, 2021

(65) Prior Publication Data
US 2022/0328304 A1    Oct. 13, 2022

Related U.S. Application Data

(60) Provisional application No. 63/172,962, filed on Apr. 9, 2021.

(51) Int. Cl.
| | |
|---|---|
| H01L 21/027 | (2006.01) |
| G03F 1/26 | (2012.01) |
| G03F 1/38 | (2012.01) |
| H01L 21/033 | (2006.01) |

(52) U.S. Cl.
CPC ............ *H01L 21/0274* (2013.01); *G03F 1/26* (2013.01); *G03F 1/38* (2013.01); *H01L 21/0335* (2013.01); *H01L 21/0337* (2013.01); *H01L 21/0338* (2013.01)

(58) Field of Classification Search
None
See application file for complete search history.

(56) References Cited

U.S. PATENT DOCUMENTS

| | | | | |
|---|---|---|---|---|
| 6,994,939 | B1 * | 2/2006 | Ghandehari | G03F 1/30 430/311 |
| 2007/0037070 | A1 * | 2/2007 | Ohnuma | H01L 29/78621 430/311 |

* cited by examiner

*Primary Examiner* — William C Trapanese
(74) *Attorney, Agent, or Firm* — Lippes Mathias LLP

(57) ABSTRACT

A patterning process is performed on a semiconductor wafer coated with a bottom layer, a middle layer and a photoresist layer having a starting thickness. The patterning process includes: performing an exposure step including exposing the semiconductor wafer using a mask that includes a feature which produces an intermediate light exposure in a target area followed by processing that creates openings in the photoresist layer in accordance with the mask and thins the photoresist in the target area due to the intermediate light exposure in the target area leaving thinned photoresist in the target area; performing middle layer etching to form openings in the middle layer aligned with the openings in the photoresist layer, wherein the middle layer etching does not remove the middle layer in the target area due to protection provided by the thinned photoresist; and performing trim etching to trim the middle layer in the target area.

20 Claims, 11 Drawing Sheets

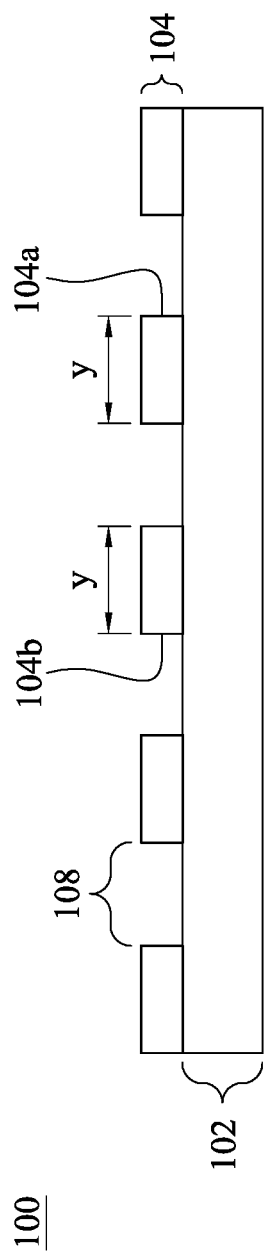
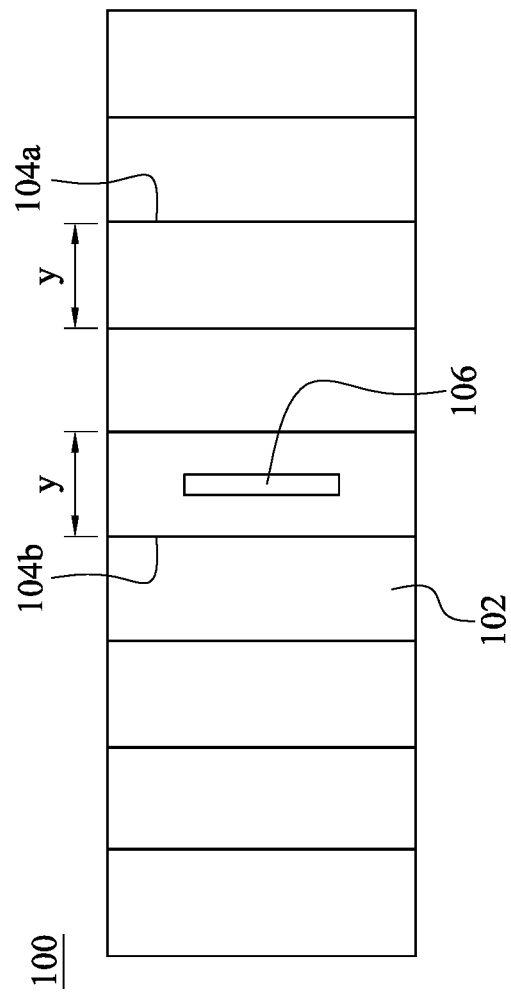

DUAL CRITICAL DIMENSION PATTERNING

This application claims the benefit of U.S. Provisional Patent Application No. 63/172,962, filed Apr. 9, 2021, which is incorporated by reference herein in its entirety.

BACKGROUND

The following relates to the semiconductor manufacturing arts, the semiconductor photolithography arts, the photolithographic manufacture of semiconductor devices having features with at least two differing critical dimensions and to such semiconductor devices so manufactured, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B diagrammatically illustrate side-sectional and top views, respectively, of a photomask according to a nonlimiting exemplary embodiment disclosed herein.

FIG. 2, upper portion, shows a portion of a reference photolithography sequence.

DETAILED DESCRIPTION

Figure 2:
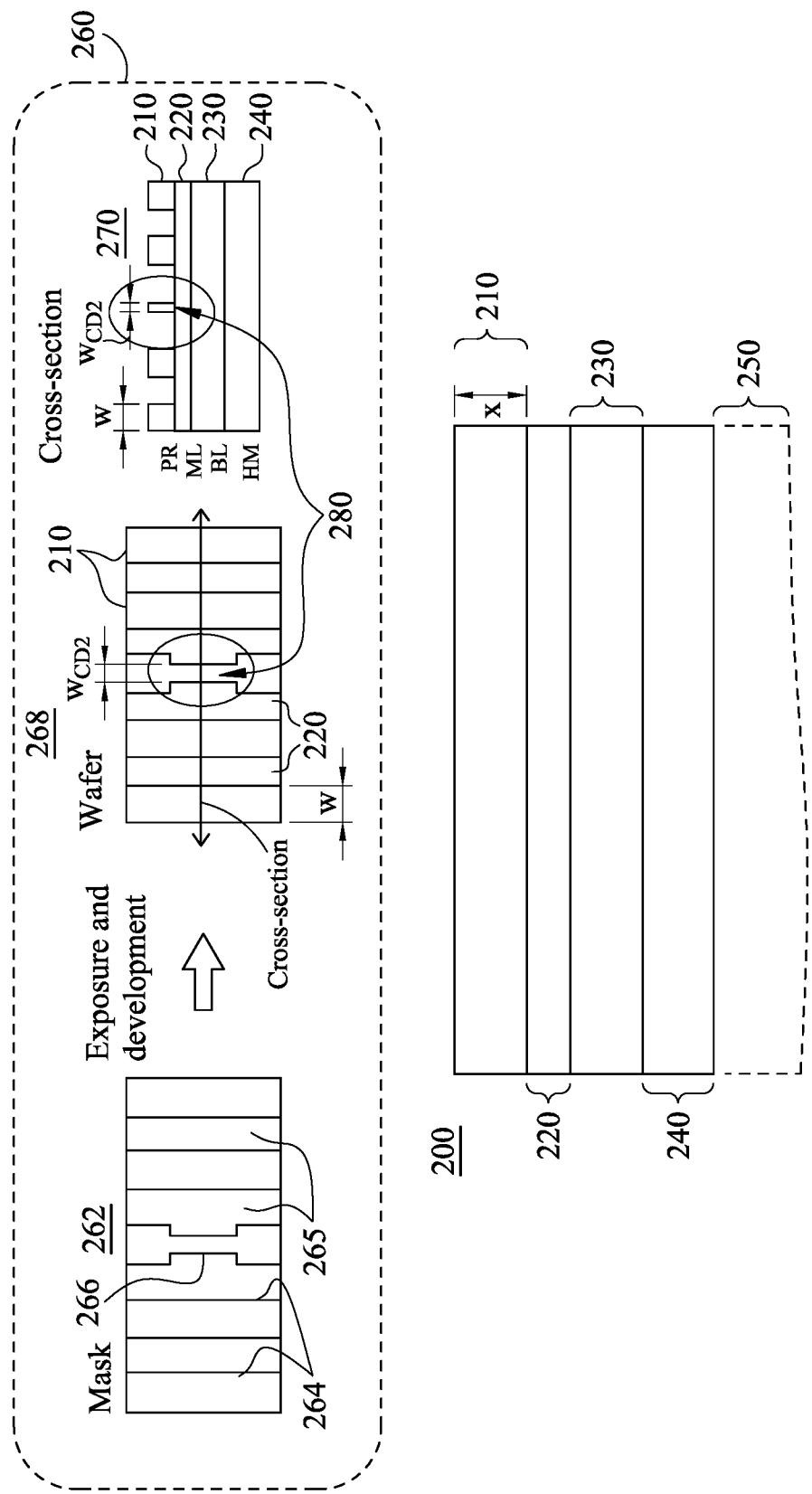
FIG. 2, lower drawing, diagrammatically illustrates a side-sectional view of a semiconductor structure and/or wafer which may be subjected to a photolithography process, for example, employing the photomask of FIGS. 1A and 1B, according to some exemplary embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, some embodiments disclosed herein relate to a photolithography process used to manufacture a semiconductor device or structure having at features on the same pitch with at least two different target critical dimensions (CDs), in some embodiments using a single photomask and/or exposure. In some embodiments, light and/or radiation leakage from a sub-resolution assist feature (SRAF) incorporated in and/or on the photomask, for example, such as a mask scattering bar or a designed area of local phase shift in a phase shift mask (PSM), operates to produce an effective exposure of a photoresist layer on the semiconductor structure such that when the photoresist layer is developed, the photoresist layer is thinned at a selected location, but not entirely dissolved and/or otherwise removed, while still retaining a desired CD in the photoresist layer. The SRAF is a thus non-printing feature, but provides thinning of the photoresist in the area designated for a feature with smaller CD to facilitate fabricating the feature with smaller CD using a single mask as disclosed herein. Maintaining the larger CD in this thinned region of the photoresist layer can help guard against the potential for peeling. Moreover, the use of a single photomask and/or exposure can help reduce and/or limit production costs and/or process cycle times.

In some embodiments, during one or more subsequent etching processes, a feature in a layer under the photoresist at the location where the photoresist had been thinned during development is trimmed to a target CD which is less than a target CD of a feature formed under where the photoresist had not been thinned during development.

In accordance with some embodiments of the present disclosure and with reference to FIGS. 1A and 1B, there is shown a side view and a top view, respectively, of a photomask (also referred to as mask or reticle) 100 having a design or pattern 104, for example, defining an integrated circuit (IC) or the like. In some embodiments, the design or pattern 104 is arranged such that the photomask 100 may be used for forming one or more kinds of features (for example, interconnect structures, metal lines, transistors, active devices, and/or other circuit components or parts thereof, etc.) on a semiconductor structure or wafer using a photolithography process. As shown, the photomask 100 includes a photomask substrate 102 and the design or pattern 104 formed thereon. In practice, it is to be understood that the photomask 100 and the included design or pattern 104 may in fact be part of a larger and more complicated photomask (not shown). Suitably, the photomask 100 may be used to pattern one or more layers of a semiconductor structure or wafer during a photolithography patterning process.

As mentioned above, the photomask 100 includes the photomask substrate 102 and the design or pattern 104 formed thereon. In some embodiments, for example, when the photolithography technique employs ultraviolet (UV) or deep ultraviolet (DUV) light and/or radiation for patterning features on a wafer, the photomask substrate 102 may be formed from a transparent material, for example, such as fused quartz. In some embodiments, the design or pattern 104 on the photomask substrate 102 may be formed from a suitably opaque material, for example, such as chromium (Cr).

In some embodiments, extreme ultraviolet (EUV) light and/or radiation may be used in the photolithography process for patterning features on the wafer. In such embodiments, the photomask 100 may be a reflective photomask including a photomask substrate 102 formed from a low thermal expansion material (LTEM). In some embodiments, a reflective multilayer (ML) is deposited on the substrate 102, and an absorber layer is deposited over the reflective ML and/or otherwise formed to define the design or pattern 104. In practice, it is to be understood that other configurations and inclusion or omission of various items may be possible. For example, a capping layer may be formed between the reflective ML and absorber layer. In another example, a protection layer may be formed on the absorber layer. In yet some further alternative embodiments, the photomask 100 may be a phase shift mask (PSM), such as an attenuating PSM or an alternating PSM, for enhanced imaging resolution.

In some embodiments, as shown in FIGS. 1A and 1B, the design or pattern 104 includes two features 104a and 104b defined therein. Suitably, the features 104a and 104b are adjacent to one another and have the same or a similar dimension measured and/or otherwise taken along the same direction. For example, in the illustrated embodiment, the width of each feature 104a and 104b in the design or pattern 104 is given by the value y.

In some embodiments, as shown, a mask scattering bar 106 is formed in and/or on the feature 104b. As previously mentioned, the mask scattering bar 106 operates to allow some light and/or radiation leakage at its location during the exposure process, which in turn produces an effective exposure of the photoresist layer at a selected location on the semiconductor structure such that when the photoresist layer is developed, the photoresist layer is thinned at the selected location, but not entirely dissolved and/or otherwise removed, while still retaining a desired CD in the photoresist layer at the selected location. More generally, any other type of SRAF may be employed in place of the illustrative mask scattering bar 106 to provide this effect, such as designed area of local phase shift in a PSM.

With reference now to FIG. 2, lower drawing, there is illustrated a side-sectional view of a semiconductor structure 200 using a tri-layer structure including a photoresist layer 210, a middle layer 220 and a bottom layer 230 formed on and/or over an optional hard mask layer 240. In practice, the semiconductor structure 200 or wafer will be subjected to a photolithography process as described herein, for example, using the photomask 100 of FIGS. 1A and 1B. The photoresist layer 210 and middle layer 220 are sacrificial layers that are used, as described herein, to form a pattern in the bottom layer 230 for performing processing in selected areas of an underlying semiconductor wafer or semiconductor device 250 (indicated by dashed lines). The optional hard mask 240 is provided for processes in which the bottom layer 230 may be insufficient, such as ion implantation, some types of plasma etching, electroplating, or so forth. For example, openings formed in the bottom layer 230 may be used to perform selective etching of the hard mask layer 240 in those openings followed by etching, ion implantation, plating, or other processing of the underlying semiconductor wafer or semiconductor device 250, again restricted to those openings. On the other hand, if the bottom layer is sufficient for the process to be performed, for example in the case of some types of material deposition or some types of etching, then the hard mask 240 may be omitted and the openings in the bottom layer 230 directly used to perform the selective deposition, etching, or other process. These are merely illustrative examples, and other types of semiconductor fabrication processing operations may be performed on the underlying semiconductor wafer or semiconductor device 250 via the disclosed lithography process. By way of non-limiting illustration, in some embodiments the underlying semiconductor wafer or semiconductor device 250 may be a silicon-based semiconductor device wafer, for example comprising a silicon wafer which may optionally already have one or more layers and/or regions of (the same or another) semiconductor, dielectric, metal, or other materials or combinations of materials deposited thereon prior to the lithographically controlled processing to be performed in conjunction with the stack 210, 220, 230, and optionally 240.

In some embodiments, the hard mask layer 240 includes and/or is optionally formed from silicon nitride (SiN), silicon dioxide ($SiO_2$), titanium nitride (TiN), aluminum dioxide ($AlO_2$) and/or other like materials, including suitable combinations thereof. The hard mask 240 is of a material and thickness sufficient to withstand the plasma etching, ion implantation, electroplating, or other processing to be performed on the underlying semiconductor wafer or semiconductor device 250.

In some embodiments, before forming the photoresist layer 210, the bottom layer 230 is formed on and/or over the hard mask layer 240, and the middle layer 220 is formed on and/or over the bottom layer 230. Suitably, the bottom layer 230 and the middle layer 220 may be formed using any suitable coating technique, for example, such as a spin-on coating process. In some embodiments, other manufacturing steps, such as baking, may optionally be further applied to the bottom layer 230 and the middle layer 220. In some embodiments, the middle layer 220 is formed from carbon (C), oxygen (O), silicon (Si), and/or other suitable materials, and combinations thereof.

In some embodiments, the photoresist layer 210 is formed over the hard mask layer 240. The forming of the photoresist layer 210 optionally includes coating a first photoresist solution on the middle layer 220 by a suitable technique, for example, such as spin-on coating. In some suitable embodiments, other manufacturing steps, for example, such as baking may be further applied to the photoresist layer 210. In some embodiments, the photoresist layer 210 may include and/or be formed from a positive photoresist material that may become dissolvable to a developer solution after exposure to a light/radiation source. In some embodiments, the photoresist layer 210 may include and/or be formed from a negative photoresist material that becomes indissolvable to the developer solution after exposure to the light/radiation source. Suitably, the composition of the photoresist layer 210 may be adjusted, for example, by changing the ratio of carbon, hydrogen and/or oxygen therein, to have a suitable exposure threshold for the proposed photolithography exposure process as discussed later in the present disclosure. In some embodiments, the photoresist layer 210 is formed with an original or starting thickness. For example, as shown, the original or starting thickness of the photoresist layer 210 is given by the value x.

With reference now to FIG. 2, upper portion, a portion of a reference photolithography sequence 260 suitably performed on the semiconductor structure 200 is described. A mask 262 is provided, which includes one or more light absorbing or reflective regions 264 (e.g., absorbing in the case of a reflective mask, or reflective in the case of a transmission mask) for imprinting features of a first CD and at least one light absorbing or reflective region 266 for imprinting a feature of a second CD that is smaller than the first CD. The remaining regions 265 are reflective or transmissive, for reflection or transmission masks, respectively.

As seen in a plan view 268 and cross-sectional view 270, after using the mask 262 to expose and develop the photoresist layer 210 on the semiconductor structure 200, the photoresist (which here is assumed to be a positive photoresist) is present in regions corresponding to the light absorbing or reflective regions 264 of the mask 262, due to the photoresist being shielded from light exposure in these regions. On the other hand, the photoresist layer 210 is removed to expose the middle layer 220 in regions corresponding to the light reflective or transmissive regions 266 of the mask 262, due to the light exposure weakening chemical bonds of the photoresist in these regions to enable the developer to remove the photoresist in these regions.

As further seen in FIG. 2, upper portion 260, the regions 264 have the first CD, indicated by width w in the plan view 268 and side sectional view 270. On the other hand, the region 280 corresponding specifically to the light absorbing or reflective region 266 imprints as a photoresist region (i.e. feature) having a width $w_{CD2}$ corresponding to the smaller second CD. For example, in the case of a transistor or the like, the region 280 may be intended to be fabricated to form a polymer gate of the transistor, where $w_{CD2}$ corresponds to the channel length.

A problem can arise, however, in that depending on the width $w_{CD}$ of the second CD and other factors, this region 280 of photoresist may be susceptible to damage or delamination, for example by way of photoresist peeling. More generally, if the pitch resolution or peeling/scum window is sufficient in the lithography, then using different dimension on mask (DOM) is feasible to obtain a different CD target (such as the width $w_{CD2}$ of region 280) in the patterned photoresist layer. If the pitch resolution or peeling/scum window is not sufficient, one way to provide the second CD may be to use a two-mask exposure to trim the smaller CD. However, this increases cost and cycle time due to use of two masks, and furthermore the pattern design may be constrained based on the second mask type.

Figure 3:
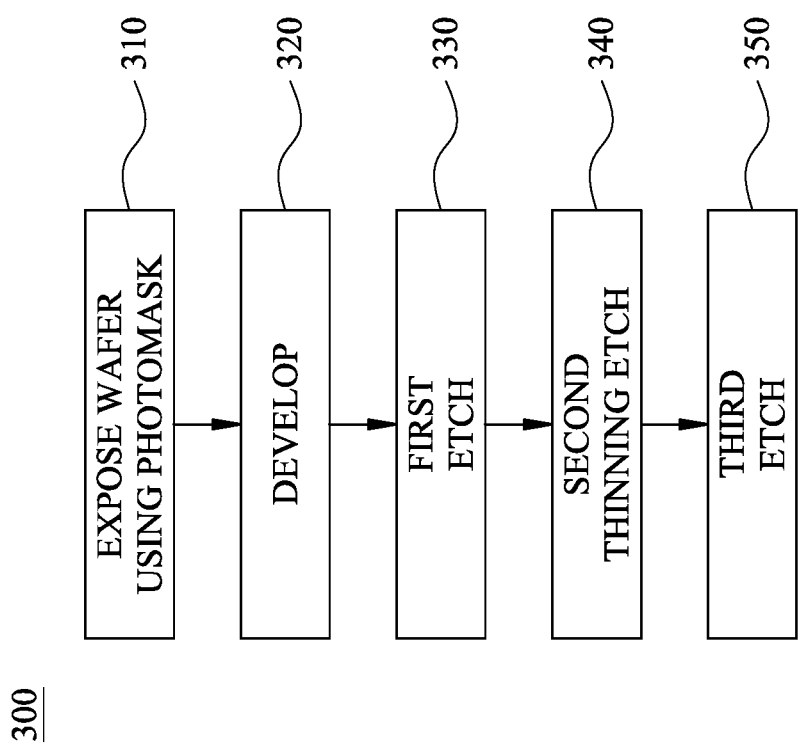
FIG. 3 is a flow chart illustrating an exemplary photolithography process applied, for example, to the semiconductor structure of FIG. 2, in accordance with some embodiments disclosed herein, for example, using the photomask of FIGS. 1A and 1B.

With reference to FIG. 3 and in accordance with some embodiments, there is now described a photolithography process 300 that uses the photomask 100 of FIG. 1 to pattern features of at least two different CDs on the semiconductor structure 200, which can avoid the aforementioned potential for photoresist peeling or other damage of the smaller CD photoresist pattern regions. Ultimately, one of at least two features will be formed to have a first target critical dimension (CD) and another one of the at least two features will be formed to have a second target CD which is less than the first target CD. As described herein, FIGS. 4A and 4B through 7A and 7B show area side-sectional views and top views, respectively, of the semiconductor structure 200 at and/or after various stages in the process 300.

Figure 4A:
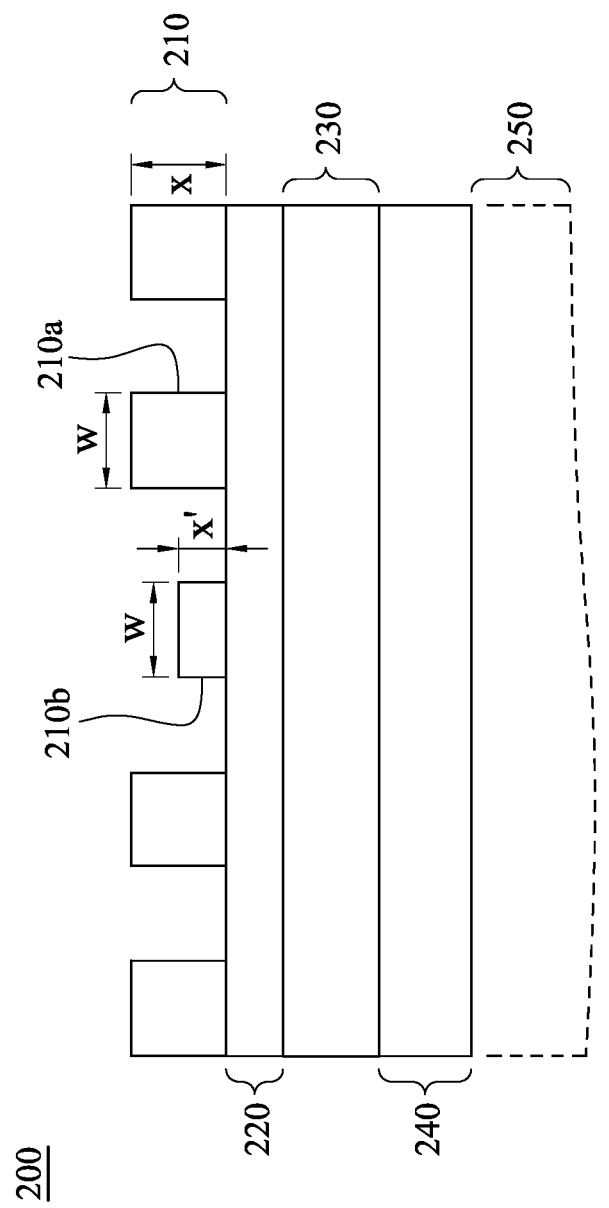
FIGS. 4A and 4B diagrammatically illustrate an area cross-section view and a top view, respectively, of the semiconductor structure and/or wafer of FIG. 2 following a development step applied thereto in accordance with the process shown in FIG. 3.
Figure 4B:
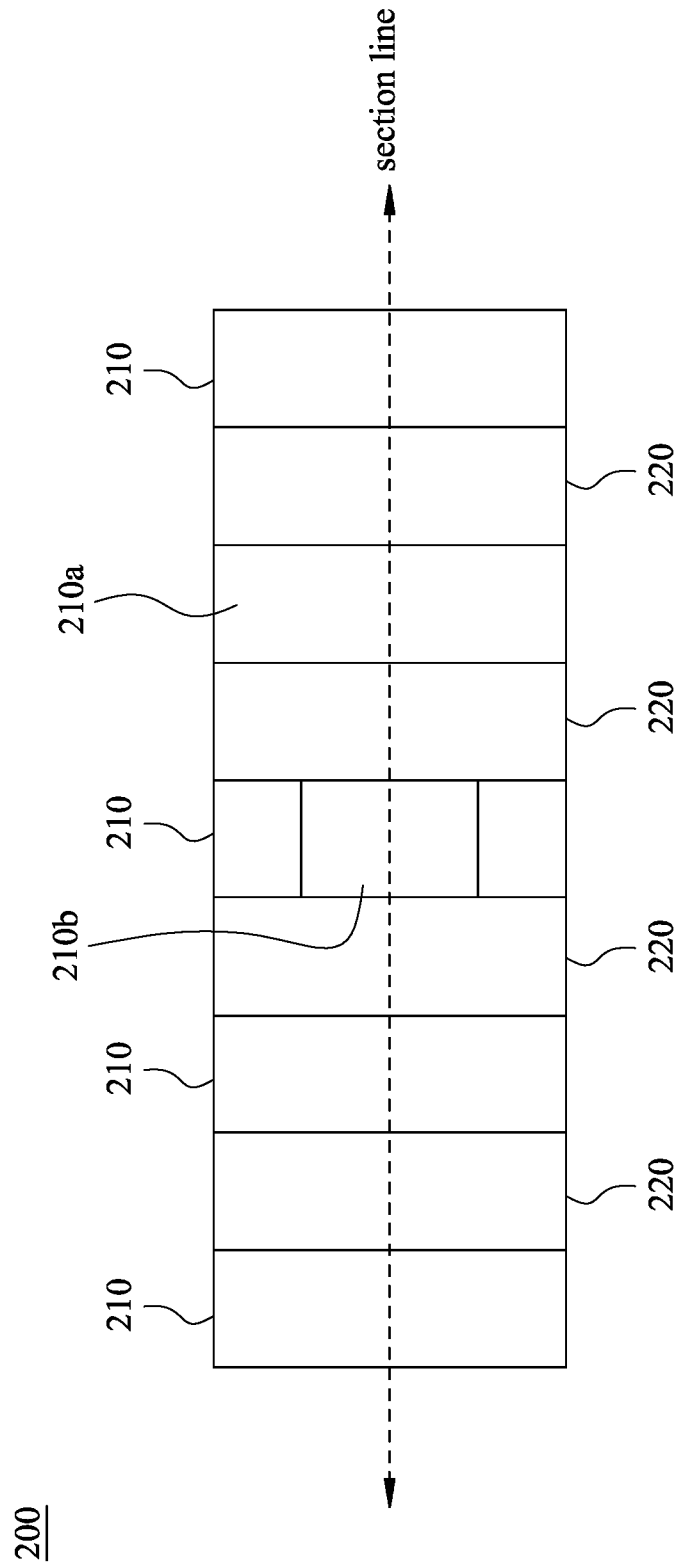
Figure 6A:
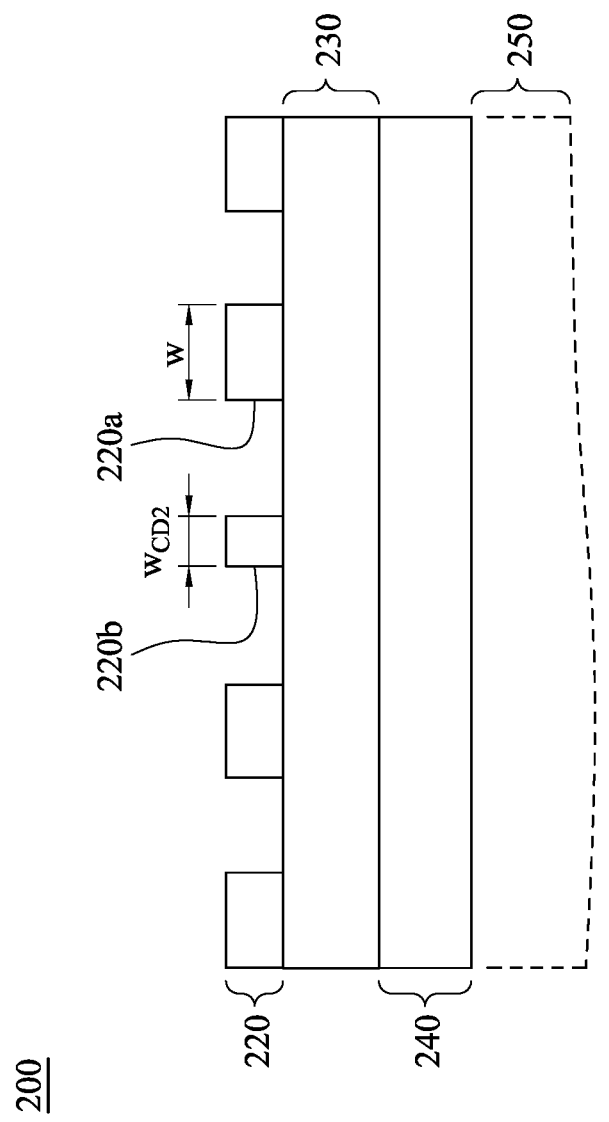
FIGS. 6A and 6B diagrammatically illustrate an area cross-section view and a top view, respectively, of the semiconductor structure and/or wafer of FIG. 2 following a second or trim etching step applied thereto in accordance with the process shown in FIG. 3.
Figure 6B:
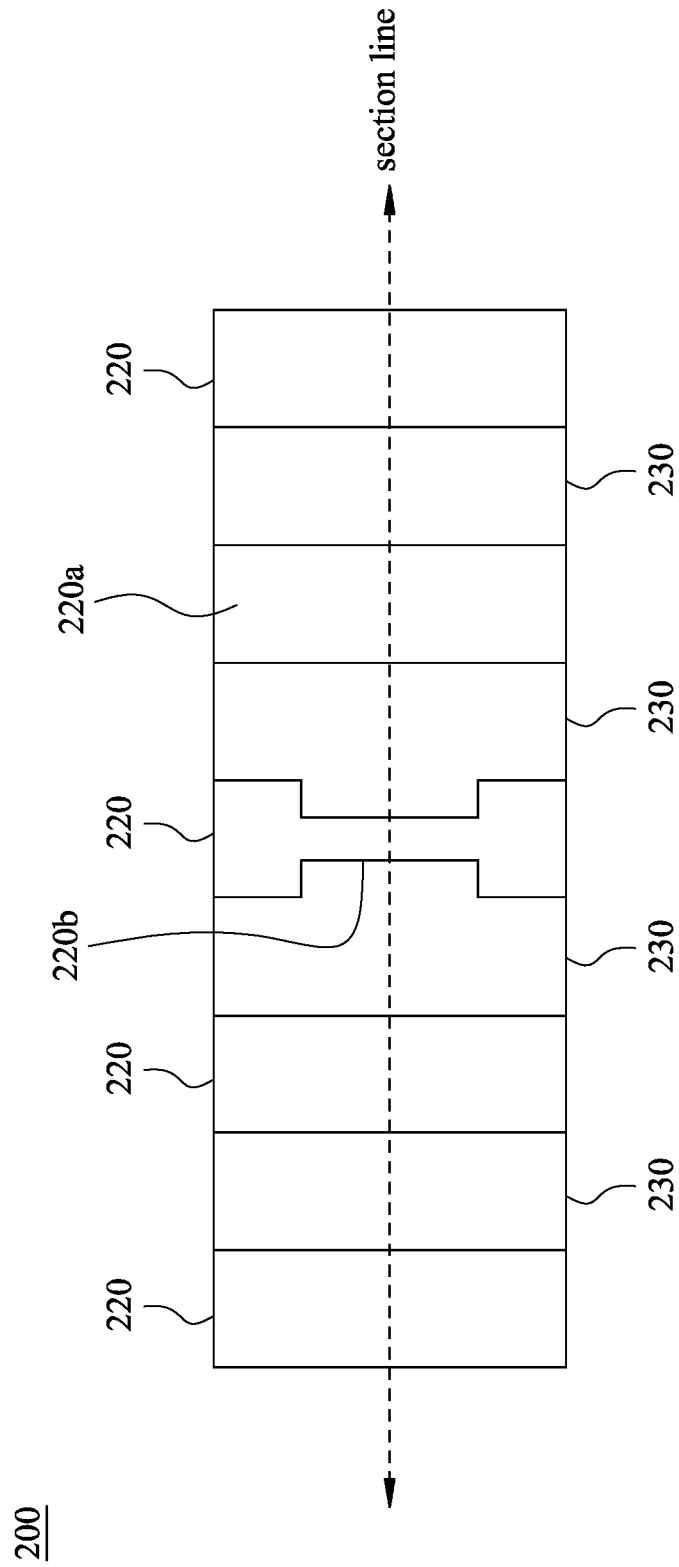
Figure 7A:
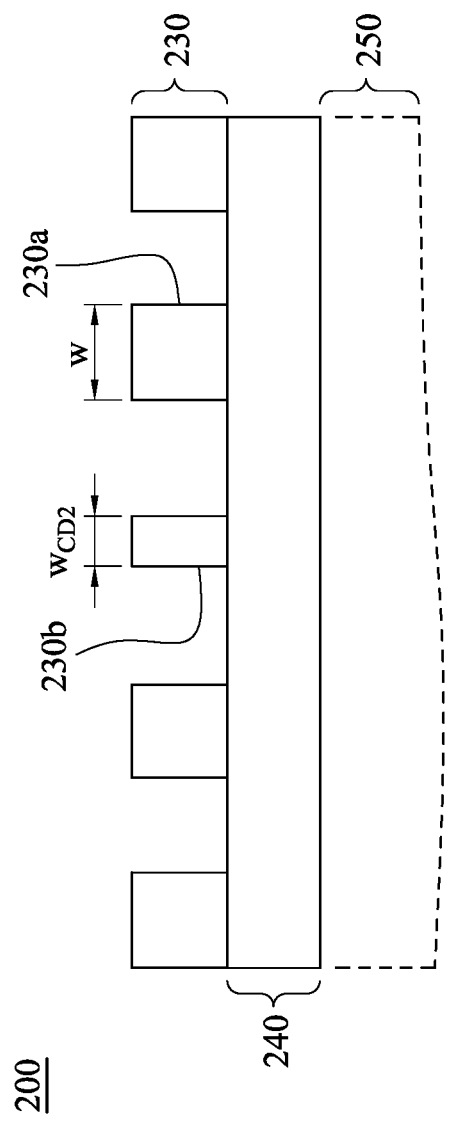
FIGS. 7A and 7B diagrammatically illustrate an area cross-section view and a top view, respectively, of the semiconductor structure and/or wafer of FIG. 2 following a third etching step applied thereto in accordance with the process shown in FIG. 3.
Figure 7B:
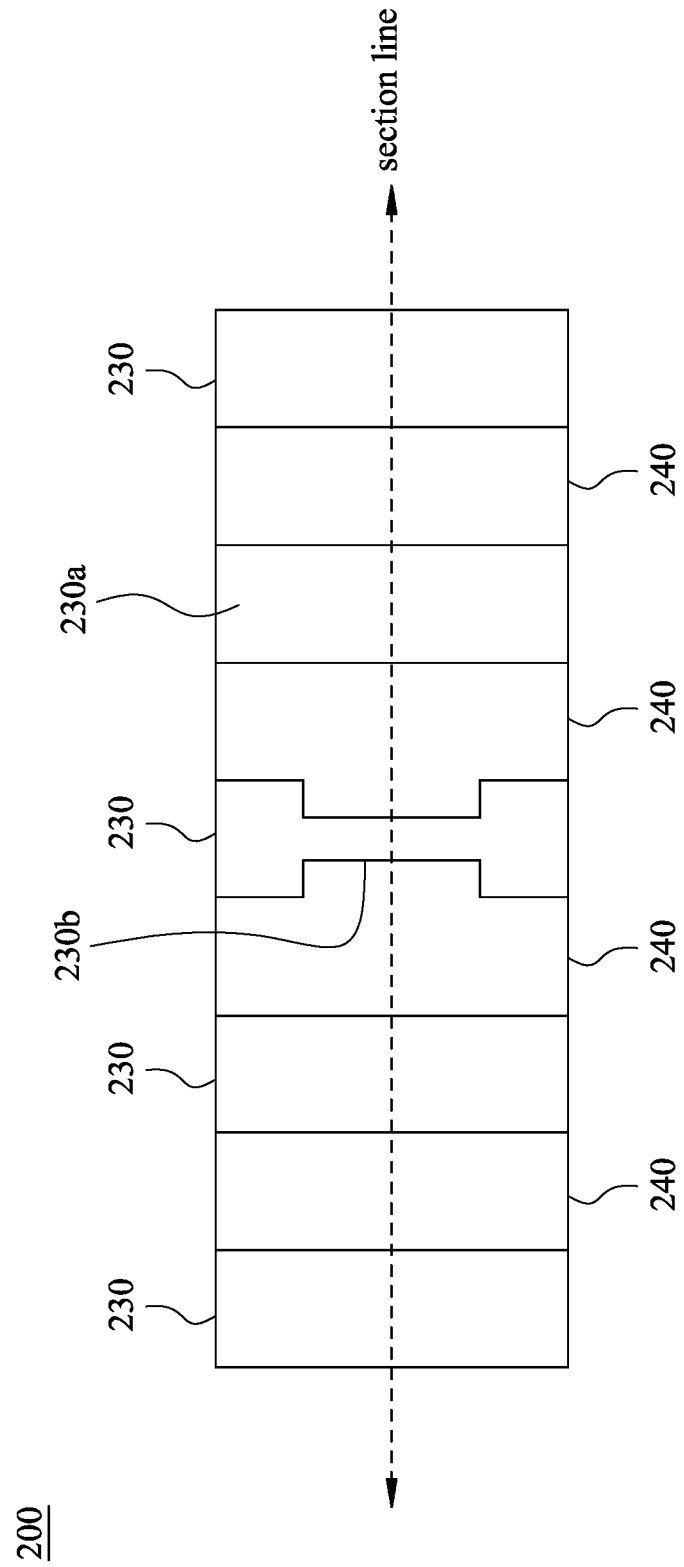

In particular, FIGS. 7A and 7B show the resultant semiconductor structure 200 after the final step described in the process 300 has been carried out. In the illustrated embodiment, features 230a and 230b are ultimately patterned and/or otherwise formed in the bottom layer 230. As shown, the feature 230a has a first target CD w and the feature 230b has a second target CD $w_{CD2}$, where $w_{CD2}<w$ and the target CDs are measured along and/or taken in the same direction, for example, in the direction of the pitch. However, as shown in FIGS. 4A and 4B, this is achieved with the initial exposure/develop step producing a photoresist region 220b of a wider thickness, corresponding to the larger first target CD. This wider photoresist region 220b (as compared with the photoresist region 280 of the reference photolithography process of FIG. 2) is more resistant to photoresist peeling or other damage, thus increasing device yield. Additionally, the photolithography process of FIGS. 3 and 4A, 4B, 5A, 5B, 6A, 6B, 7A, 7B employs only a single mask to achieve this benefit.

With reference again to FIG. 3, the process 300 begins with an exposure step 310. In the exposure step 310, the photomask 100 and the semiconductor structure 200 or wafer are suitably registered and/or aligned with one another, and UV, DUV or EUV light and/or radiation (for example, from a suitable source thereof) is transmitted through or reflected from the photomask 100 onto the photoresist layer 210 of the semiconductor structure 200. This forms a latent image in the photoresist layer 210 corresponding to the design and/or pattern 140 on the photomask 100.

Following the exposure step 310, a development step 320 is suitably carried out. During the development step 320, a developer solution is applied to the photoresist layer 210 to thereby dissolve and/or otherwise selectively remove potions thereof in accordance with the exposure produced by the exposure step 310. In practice, when a positive photoresist material is used for the photoresist layer 210, that portion exposed to the light and/or radiation received from the photomask 100 is generally dissolved and/or otherwise removed during the development step 320. Alternately, when a negative photoresist material is used for the photoresist layer 210, that portion not exposed to the light and/or radiation received from the photomask 100 is generally dissolved and/or otherwise removed during the development step 320. The operations 310 and 320 are collectively referred to herein as an exposure and development step, and corresponds for example to the exposure and development step of the reference lithography process 260 of FIG. 2 (but using the different mask 100 of FIGS. 1A and 1B which has the sub-resolution assist feature 106, rather than the mask 262 of the process 260 which does not have this feature).

FIGS. 4A and 4B show the semiconductor structure 200 following the development step 320. As can be seen, the photoresist layer 210 has been dissolved and/or completely removed (or nearly completely removed) at some locations during the development step 320, in accordance with the exposure produced with the photomask 100 during the exposure step 310. For example, in embodiments employing a positive photoresist material, locations where the photoresist layer 210 is entirely removed during the development step 320 are those locations which receive a nominal full exposure during the exposure step 310, for example, locations corresponding to openings, voids or gaps, such as gap 108, in the design or pattern 104 of the photomask 100.

As can also be seen in FIGS. 4A and 4B, the photoresist layer 210 has not been dissolved and/or removed at some locations during the development step 320, in accordance with the exposure produced with the photomask 100 during the exposure step 310. For example, in embodiments employing a positive photoresist material, locations where the photoresist layer 210 is not removed during the development step 320 are those locations which are not exposed during the exposure step 310, for example, locations corresponding to where the design or pattern 104 of the photomask 100 absorbs or otherwise blocks transmission of the light and/or radiation so that it is not received by the photoresist layer 210 during the exposure step 310. More specifically, in some suitable embodiments, in accordance with the exposure produced with the photomask 100 during the exposure step 310, in at least one location, for example, the photoresist layer 210 is unaltered and/or otherwise remains intact at or near its original thickness x following the development step 320, thereby forming a first feature 210a in the photoresist layer 210 having a thickness x and a width or CD in the photoresist layer 210 of w. This width w may correspond to the width w of the patterned photoresist layer shown in the plan and side-sectional views 268, 270 of the reference photolithography process 260 previously described with reference to FIG. 1.

As can further be seen in FIGS. 4A and 4B, in yet at least one other location, for example, the photoresist layer 210 has been only partially dissolved and/or removed during the development step 320, in accordance with the exposure produced with the photomask 100 during the exposure step 310. More specifically, the feature 210b formed in the photoresist layer 210 results from thinning of the photoresist layer 210 at this selected or target location during the development step 320 from its original thickness x to a thickness x' which is less than the thickness x, but the photoresist layer 210 has not been entirely dissolved and/or removed at the selected or target location by the development step 320. Suitably, the feature 210b nevertheless retains a width or CD of w, i.e., about the same as the feature 210a formed in the photoresist layer 210. This can be contrasted with the narrower width $w_{CD2}$ corresponding to the second CD of this feature in the patterned photoresist layer shown in the plan and side-sectional views 268, 270 of the reference photolithography process 260 of FIG. 1. Because the patterned photoresist region 210b is of the larger width w of the larger first CD, rather than the narrower width $w_{CD2}$ of the narrower second critical dimension, the likelihood of photoresist peeling or other damage occurring to this region 210b is substantially reduced, thus improving device yield.

It is to be appreciated that the thinning of the photoresist layer 210 at the selected or target location to form the feature 210b in the photoresist layer 210 is achieved with the aid of the mask scattering bar 106 provided in and/or on the photomask 100. That is to say, the mask scattering bar 106 cause the selected or target location of the photoresist layer 210 to receive a limited light exposure, for example, from a leakage of light and/or radiation at the mask scattering bar 106 during the exposure step 310. In some embodiments, this limited exposure is less than the nominal full exposure, for example, received at other locations of the photoresist layer 210 corresponding to openings, voids and/or gaps in the design or pattern 104 of the photomask 100, such as the gap 108. Notably, diffraction of the light passing through the scattering bar 106 causes this light to be spread out over a larger target area, with the light intensity being reduced to an intermediate light exposure in a target area due to the spreading of the light. By suitable design of the width of the scattering bar 106 for the wavelength and intensity of light used in the exposure step 310 (such design being suitably done using first principles optical diffraction theory or simulation, followed by verification test runs, for example), the spread of the diffracted light and its reduced intensity due to that spread can be designed to produce a desired thinning of the photoresist in the region 210b, without fully removing the photoresist in the region 210b. While a scattering bar 106 is shown as the illustrative embodiment, more generally any sub-resolution assist feature (SRAF) 106 can be used and suitably designed to provide the desired lower intensity of diffracted light over the defined area to form region 210b. For example, a designed area of local phase shift in a phase shift mask (PSM) can be used for this purpose. Accordingly, as the selected or target location of the photoresist layer 210 has received less than the nominal full exposure, the photoresist layer 210 in the selected and/or target location is not fully dissolved or otherwise removed during the development step 320, rather it is merely thinned from an original thickness x to a thickness x' less than x, while maintaining a width and/or CD in the photoresist layer 210 of w, that is the same or similar to the width and/or CD of other features, for example, such as feature 210a formed in the photoresist layer 210.

That is to say, in some embodiments, during the exposure step 310, the photomask 100 produces an exposure pattern on the photoresist layer 210 according to the design or pattern 104 of the photomask 100, in which: (i) one or more regions of the photoresist layer 210 (i.e., exposed areas, for example, corresponding to where openings, voids and/or gaps such as the gap 108 reside in the design or pattern 104 of the photomask 100) receive a nominally full light and/or radiation exposure as a result of the exposure step 310; (ii) one or more other regions of the photoresist layer 210 (i.e., unexposed areas, for example, corresponding to where light and/or radiation is absorbed and/or blocked by the design or pattern 104 of the photomask 100 during the exposure step 310) receive little or no light and/or radiation exposure as a result of the exposure step 310; and (iii) at least one selected or target region of the photoresist layer 210 (i.e., a partially exposed area, corresponding to the location of the mask scattering bar 106 provided in and/or on the photomask 100) receives a limited or intermediate exposure to light and/or radiation during the exposure step 310, where the limited or intermediate light/radiation exposure is less than the nominally full light/radiation exposure but still greater than the little or no light/radiation exposure. Accordingly, during the subsequent development step 320, assuming a positive photoresist material has been used for the photoresist layer 210: (i) the exposed areas of the photoresist layer 210 are removed entirely; (ii) the unexposed areas remain intact and/or unaltered; and (iii) the partially exposed area of the photoresist layer 210 is partially removed or thinned from its original thickness x to a lesser thickness x', while retaining its width or CD w.

Following the development step 320, the semiconductor structure 200 or wafer is subjected to a first etching step 330. In some embodiments, the first etching step 330 may be either an isotropic etch or an anisotropic etch. In some embodiments, the first etching step 330 may be performed via a suitable vapor or gas phase silicon etching process, for example, using a suitable fluorocarbon such as $C_4F_6$, $C_4F_8$, etc.

Figure 5A:
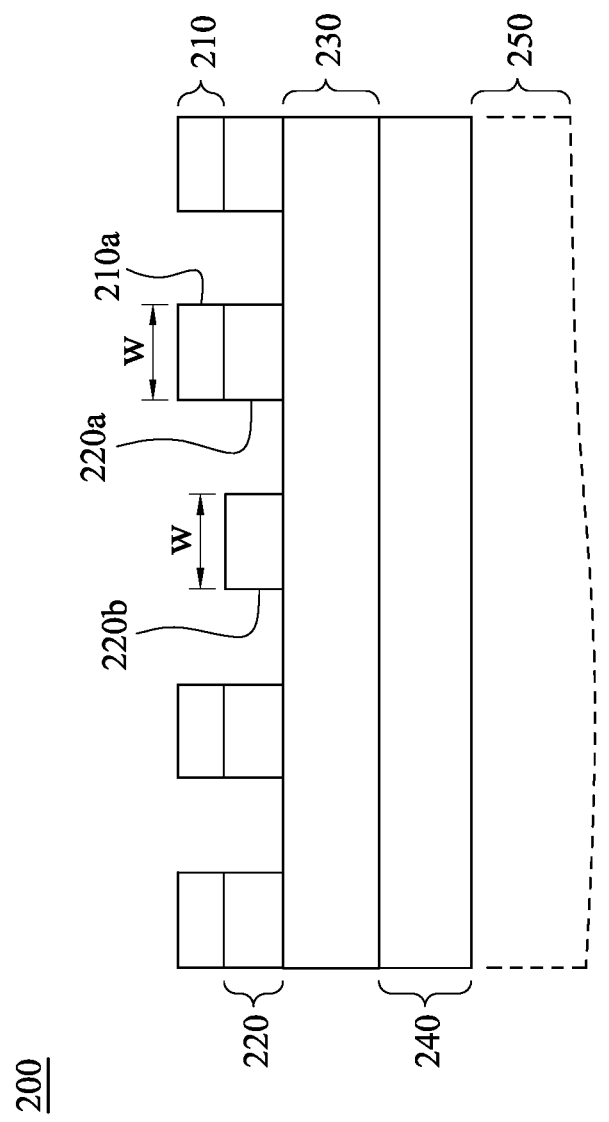
FIGS. 5A and 5B diagrammatically illustrate an area cross-section view and a top view, respectively, of the semiconductor structure and/or wafer of FIG. 2 following a first etching step applied thereto in accordance with the process shown in FIG. 3.
Figure 5B:
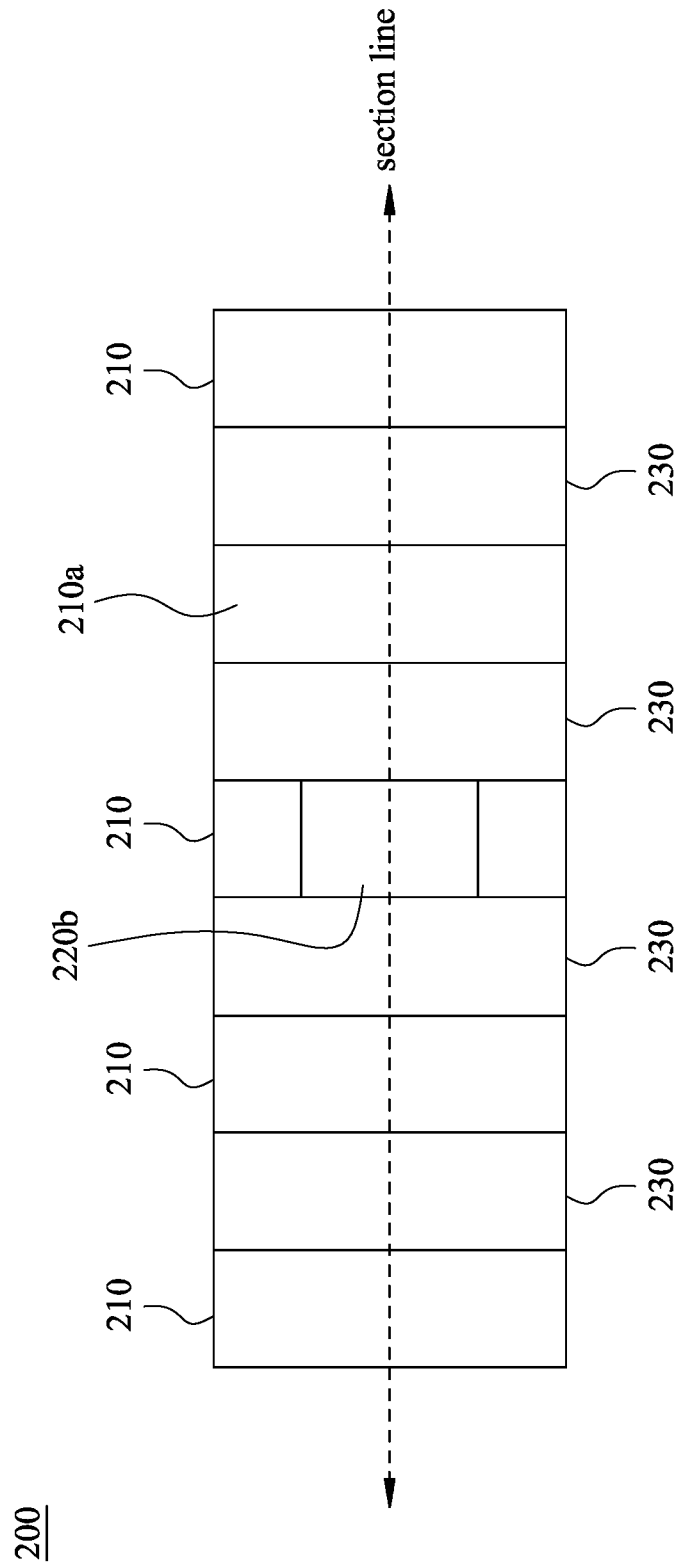

In practice, the first etching step 330 operates to form openings in the middle layer 220 corresponding to where openings had been previously formed in the photoresist layer 210, i.e., (assuming a positive photoresist material) those locations where the photoresist layer 210 had received a nominal full exposure during the exposure step 310 and thereafter had been entirely dissolved and/or otherwise removed during the development step 320. FIGS. 5A and 5B show the semiconductor structure 200 following the first etching step 330.

In some suitable embodiments, the first etching step 330 also operates to remove and/or thin the remaining photoresist layer 210 at given locations depending on the thickness of the photoresist layer 210 at those given locations following the development step 320. More specifically, at locations where the photoresist layer 210 had not been previously thinned or removed during the development step 320, for example, at feature 210a, the first etching step 330 results in only partial removal and/or thinning of the photoresist layer 210. However, at locations where the photoresist layer 210 had been previously thinned or otherwise partially removed during the development step 320, for example, at feature 210b, the first etching step 330 suitable results in a complete (or nearly complete) removal of the remaining previously thinned photoresist layer 210.

As can been seen in FIGS. 5A and 5B, the feature 220a formed in the middle layer 220 as a result of the first etching step 330 remains covered and/or otherwise protected by a portion of the photoresist layer 210, namely, the remaining portion of feature 210a formed in the photoresist layer 210. Conversely, the feature 220b formed in the middle layer 220 as a result of the first etching step 330 has been uncovered and/or exposed (or at least is nearly uncovered or nearly exposed). That is to say, the feature 220b formed in the middle layer 220 as a result of the first etching step 330 is not covered and/or otherwise protected by any (or any substantial) remaining portion of the photoresist layer 210.

Returning attention to FIG. 3, following the first etching step 330, a second or trim etching step 340 is applied to the semiconductor structure 200 or wafer. FIGS. 6A and 6B illustrate the semiconductor structure 200 following the second/trim etching step 340. In some embodiments, the second/trim etching step 320 may be either an isotropic etch or an anisotropic etch. Suitably, there is a relatively high sensitivity between the photoresist layer 210 and the middle layer 220 with respect to the second/trim etching step 340.

In some suitable embodiments, the second/trim etching step 340 operates to selectively trim and/or narrow features formed in the middle layer 220 depending on whether or not those features formed in the middle layer 220 as a result of the first etching step 330 are still covered and/or otherwise protected by a remaining portion of the photoresist layer 210 when the second/trim etching step 340 is applied. More specifically, those features formed in the middle layer 220 which are still covered and/or otherwise protected by a remaining portion of the photoresist layer 210 after the first etching step 330 (for example, such as the feature 220a which is still covered and/or protected after the first etching step 330 by the feature 210a formed in the photoresist layer 210), are effectively not trimmed and/or narrowed as a result of the second/trim etching step 340, i.e., due to the protection from the second/trim etching step 340 provided by that portion of the photoresist layer 210 which covers or overlays the would-be untrimmed or unnarrowed feature. Accordingly, the untrimmed or unnarrowed feature, for example, such as feature 220a, retains the same (or about the same) width or CD w as it had before application of the second/trim etching step 340. Conversely, those features formed in the middle layer 220 which are not covered and/or otherwise protected by a remaining portion of the photoresist layer 210 after the first etching step 330 (for example, such as the feature 220b which is not covered and/or protected after the first etching step 330 by any remaining portion of the photoresist layer 210), are effectively trimmed and/or narrowed as a result of the second/trim etching step 340, i.e., due to the lack and/or absence of protection from the second/trim etching step 340 being provided by a suitable portion of the photoresist layer 210. Accordingly, as a result of the second/trim etching step 340, the trimmed or narrowed feature, for example, such as feature 220b, achieves a width or CD $w_{CD2}$ which is less than the width or CD w that it had before application of the second/trim etching step 340. In some embodiments, the narrowed width $w_{CD2}$ corresponds to the second target CD. Parameters of the second/trim etching step 340 such as etchant composition, etch time, plasma parameters (in the case of a plasma etch), and so forth can be designed using test runs and/or an a priori-known etch rate for the material of the middle layer 220 so as to provide the feature 220b with the desired width $w_{CD2}$.

In some suitable embodiments, in addition to the foregoing described selective trimming, the second/trim etching step 340 may also operate to remove those portions of the photoresist layer 210 which remained after the first etching step 330. Alternatively, in some suitable embodiments, a separate etching step (not shown) subsequent to the second/trim etching step 340 may be applied to the semiconductor structure 200 or wafer in order to remove those portions of the photoresist layer 210 which remained after the first etching step 330.

Returning attention to FIG. 3, following the second/trim etching step 340, a third etching step 350 is applied to the semiconductor structure 200 or wafer. FIGS. 7A and 7B illustrate the semiconductor structure 200 following the third etching step 340. Notably, feature 230a corresponding to features 210a and 220a retains the width w corresponding to the first CD, and feature 230b corresponding to trimmed feature 220b (see FIGS. 6A and 6B) retains the reduced width $w_{CD2}$ corresponding to the narrower second CD.

In some suitable embodiments, the third etching step 350 operates to form openings in and/or remove portions of the bottom layer 230 corresponding to and/or aligned with those locations where openings, voids and/or gaps had been previously formed in the middle layer 220, while regions or portions of the bottom layer 230 that correspond to and/or align with portions of the middle layer 220 that remained intact after the second/trim etching step 340 are not removed by the third etching step 350.

In some suitable embodiments, in addition to the foregoing described removing of the bottom layer 230, the third etching step 350 may also operate to remove those portions of the middle layer 220 which remained after the second/trim etching step 340. In some suitable embodiments, a separate etching step (not shown) subsequent to the third etching step 350 may be applied to the semiconductor structure 200 or wafer in order to remove those portions of the middle layer 220 which remained after the second/trim etching step 340.

The semiconductor structure 200 after the lithography process of FIG. 3, as shown in FIGS. 7A and 7B, is suitable for further processing depending on the particular semiconductor process being performed. For example, in one type of process, the patterned bottom layer 230 forms a mask for etching the hard mask 240 to form a corresponding pattern in the hard mask 240, which then serves as the pattern for performing patterned processing of the underlying semiconductor wafer or semiconductor device 250, such as ion implantation, plasma etching, or the like. In some embodiments, the hard mask 240 may be omitted, and in this case the patterned bottom layer 230 directly serves as the pattern for performing patterned processing of the underlying semiconductor wafer or semiconductor device 250, such as material deposition. These are merely nonlimiting illustrative examples.

The foregoing description largely refers to embodiments employing a positive photoresist material for the photoresist layer 210. It is to be appreciated however that suitable modifications can be made to accommodate the use of a negative photoresist material for the photoresist layer 210, which modifications and use of a negative photoresist material are contemplated in accordance with some embodiments disclosed herein. For example, in embodiments where a negative photoresist material is employed for the photoresist layer 210, the mask scattering bar 106 is suitably formed from a light/radiation absorbing and/or blocking material arranged on the photomask substrate 102 at a location in an opening, void or gap, such as the gap 108, defined by the design or pattern 104 of the photomask 100. In this way, the corresponding target area on the photoresist layer 210, which would otherwise be fully exposed absent the mask scattering bar 106, is in fact only partially exposed due to the mask scattering bar 106 blocking or absorbing some of the light/radiation which would have otherwise been transmitted and/or reflected to the target area on the photoresist layer 210.

In some embodiments, the amount of thinning ultimately achieved in the photoresist layer 210 at the target area, for example, where the feature 210b is formed, can be established by regulating the light/radiation leakage at the mask scattering bar 106. That is to say, the resulting height x' of the feature 210b in the photoresist layer 210 produced by the development step 320 generally depends on the amount of light/radiation leakage allowed/caused by the mask scattering bar 106 which is received in and/or by the target area of the photoresist layer 210 during the exposure step 310. Accordingly, in some embodiments, the size, shape and/or angle of the mask scattering bar 106 is selected to achieve the appropriate amount of the light/radiation leakage which will in turn produce the desired amount of thinning of the photoresist layer 210 during the development step 320, for example, at the location of the feature 210b formed in the photoresist layer 210. In some embodiments, other SRAFs may be employed in and/or on the photomask 100 to the same or similar effect achieved with the mask scattering bar 106. For example, in some embodiments, the SRAF may utilize techniques such as local phase shifting, mask profile optimization for ILS (Image Log-Slope) (contrast) loss, etc.

In some embodiments, the semiconductor structure 200 optionally includes additional middle layers and/or bottom layers and additional differing feature widths and/or CDs may be achieved by additional and/or separate etching and/or trimming steps.

In the following, some further illustrative embodiments are described.

In some embodiments, a patterning process is performed on a semiconductor wafer coated with a bottom layer, a middle layer and a photoresist layer having a starting thickness. The patterning process includes: performing an exposure step including exposing the semiconductor wafer using a mask that includes a feature which produces an intermediate light exposure in a target area followed by processing that creates openings in the photoresist layer in accordance with the mask and thins the photoresist in the target area due to the intermediate light exposure in the target area leaving thinned photoresist in the target area; performing middle layer etching to form openings in the middle layer aligned with the openings in the photoresist layer, wherein the middle layer etching does not remove the middle layer in the target area due to protection provided by the thinned photoresist; and performing trim etching to trim the middle layer in the target area.

In some further embodiments, the patterning process further includes: removing the photoresist layer; and performing bottom layer etching to form openings in the bottom layer aligned with the openings in the middle layer.

In still additional embodiments, the feature which produces the intermediate light exposure in the target area is a mask scattering bar.

In some embodiments, the feature which produces the intermediate light exposure in the target area is an area of the mask having a local phase shift.

In yet further embodiments, following the middle layer etching the middle layer has formed therein at least two features, each of the at least two features being defined between adjacent openings formed in the middle layer and having a first width defined by a spacing of the adjacent openings.

In some further embodiments, the trim etching narrows one of the at least two features to a second width less than the first width.

In some embodiments, the narrowed feature aligns with the target area where the photoresist layer was thinned.

In yet further embodiments, the trim etching does not narrow one of the at least two features such that it retains its first width.

In some embodiments, a patterning process is performed on a semiconductor wafer coated with a photoresist layer. The patterning process includes exposing a semiconductor wafer to light using a mask to produce an exposure pattern including: exposed areas of the semiconductor wafer that receive a full light exposure, unexposed areas of the semiconductor wafer that receive no light exposure, and at least one target area of the semiconductor wafer that receives an intermediate light exposure that is less than the full light exposure. The patterning process further includes: after the exposing, processing the semiconductor wafer to create openings in the photoresist layer in accordance with the exposed and unexposed areas and thin the photoresist layer in the at least one target area; performing an first etch to form openings in a first layer of the semiconductor wafer underneath the photoresist layer that are aligned with the openings in the photoresist layer, wherein the first etch does not form an opening in the first layer aligned with the at least one target area; and performing trim etching to trim the first layer in the at least one target area.

In some further embodiments, the patterning process further includes: removing the photoresist layer; and performing a second etch to form openings in a second layer of the semiconductor wafer disposed underneath the first layer that are aligned with the openings in the first layer.

In still further embodiments, following the first etch the first layer has formed therein at least two features, each of the at least two features being defined between adjacent openings formed in the first layer and having a first width defined by a spacing of the adjacent openings.

In yet additional embodiments, the trim etching narrows one of the at least two features to a second width less than the first width.

In some further embodiments, the narrowed feature aligns with the target area where the photoresist layer was thinned.

In some additional embodiments, the trim etching does not narrow one of the at least two features such that it retains its first width.

In some embodiments, a semiconductor wafer is formed by the patterning process.

In some embodiments, a mask is provided for use in a patterning process applied to a semiconductor structure having a photoresist layer of a first thickness. The mask includes a mask substrate and a mask pattern formed on the mask substrate. The mask pattern includes: a first printable feature that is operative to print a corresponding photoresist pattern feature having a first critical dimension (CD), and a second printable feature including a sub-resolution assist feature. The second printable feature is operative to print a corresponding photoresist pattern feature having the first CD and a reduced thickness of the photoresist due to the sub-resolution assist feature.

In some further embodiments, the sub-resolution assist feature is a mask scattering bar.

In still further embodiments, the mask is one of a reflective mask or a transmissive mask.

In yet further embodiments, the sub-resolution assist feature comprises a phase-shift mask having a local phase shift defining the sub-resolution assist feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A patterning process performed on a semiconductor wafer coated with a bottom layer, a middle layer and a photoresist layer having a starting thickness, the patterning process comprising:
    performing an exposure step including exposing the semiconductor wafer using a mask that includes a feature which produces an intermediate light exposure in a target area followed by processing that creates openings in the photoresist layer in accordance with the mask and thins the photoresist in the target area due to the intermediate light exposure in the target area leaving thinned photoresist in the target area;
    performing middle layer etching to form openings in the middle layer aligned with the openings in the photoresist layer, wherein the middle layer etching does not remove the middle layer in the target area due to protection provided by the thinned photoresist; and
    performing trim etching to trim the middle layer in the target area.

2. The patterning process of claim 1, further comprising: removing the photoresist layer; and
    performing bottom layer etching to form openings in the bottom layer aligned with the openings in the middle layer.

3. The patterning process of claim 1, wherein the feature which produces the intermediate light exposure in the target area comprises a mask scattering bar.

4. The patterning process of claim 1, wherein the feature which produces the intermediate light exposure in the target area comprises an area of the mask having a local phase shift.

5. The patterning process of claim 1, wherein following the middle layer etching the middle layer has formed therein at least two features, each of the at least two features being defined between adjacent openings formed in the middle layer and having a first width defined by a spacing of the adjacent openings.

6. The patterning process of claim 5, wherein the trim etching narrows one of the at least two features to a second width less than the first width.

7. The pattering process of claim 6, wherein the narrowed feature aligns with the target area where the photoresist layer was thinned.

8. The patterning process of claim 6, wherein the trim etching does not narrow one of the at least two features such that it retains its first width.

9. The patterning process of claim 1, wherein the feature which produces the intermediate light exposure in the target area comprises a sub-resolution assist feature.

10. A patterning process performed on a semiconductor wafer coated with a photoresist layer, the patterning process comprising:
    exposing a semiconductor wafer to light using a mask to produce an exposure pattern including:
        exposed areas of the semiconductor wafer that receive a full light exposure,
        unexposed areas of the semiconductor wafer that receive no light exposure, and
        at least one target area of the semiconductor wafer that receives an intermediate light exposure that is a less than the full light exposure;
    after the exposing, processing the semiconductor wafer to create openings in the photoresist layer in accordance with the exposed and unexposed areas and thin the photoresist layer in the at least one target area;
    performing a first etch to form openings in a first layer of the semiconductor wafer underneath the photoresist layer that are aligned with the openings in the photoresist layer, wherein the first etch does not form an opening in the first layer aligned with the at least one target area; and
    performing trim etching to trim the first layer in the at least one target area.

11. The patterning process of claim 10, further comprising:
    removing the photoresist layer; and
    performing a second etch to form openings in a second layer of the semiconductor wafer disposed underneath the first layer that are aligned with the openings in the first layer.

12. The patterning process of claim 10, wherein following the first etch the first layer has formed therein at least two features, each of the at least two features being defined between adjacent openings formed in the first layer and having a first width defined by a spacing of the adjacent openings.

13. The patterning process of claim 12, wherein the trim etching narrows one of the at least two features to a second width less than the first width.

14. The patterning process of claim 13, wherein the narrowed feature aligns with the target area where the photoresist layer was thinned.

15. The pattering process of claim 13, wherein the trim etching does not narrow one of the at least two features such that it retains its first width.

16. The patterning process of claim 10, wherein the intermediate light exposure received by the at least one target area results from a sub-resolution assist feature formed on the mask.

17. The patterning process of claim 16, wherein the sub-resolution assist feature comprises a mask scattering bar.

18. The patterning process of claim 16, wherein the sub-resolution assist feature comprises a phase-shift mask having a local phase shift defining the sub-resolution assist feature.

19. A mask for use in a patterning process applied to a semiconductor structure having a photoresist layer of a first thickness, the mask comprising:
 a mask substrate; and
 a mask pattern formed on the mask substrate, the mask pattern including:
  a first printable feature that is operative to print a corresponding photoresist pattern feature having a first critical dimension (CD), and
  a second printable feature spaced apart from the first printable feature, the second printable feature including a sub-resolution assist feature wherein the second printable feature is operative to print a corresponding photoresist pattern feature having the first CD and a reduced thickness due to the sub-resolution assist feature;
 wherein the mask is a phase-shift mask having a local phase shift defining the sub-resolution assist feature.

20. The mask of claim 19, wherein the mask is one of a reflective mask or a transmissive mask.

* * * * *